United States Patent [19]
Patel

[11] Patent Number: 6,111,437
[45] Date of Patent: Aug. 29, 2000

[54] WIDE COMMON-MODE DIFFERENTIAL RECEIVER WITH PRECISION INPUT REFERRED OFFSET

[75] Inventor: Bijit Thakorbhai Patel, Breinigsville, Pa.

[73] Assignee: Lucent Technologies Inc., Murray Hill, N.J.

[21] Appl. No.: 09/087,297

[22] Filed: May 29, 1998

[51] Int. Cl.[7] .......................... H03K 5/153; H03K 17/62
[52] U.S. Cl. ............................ 327/74; 327/89; 327/407
[58] Field of Search .................................. 327/74, 75, 76, 327/77, 89, 560–563, 407, 408, 65; 330/258, 253

[56] References Cited

U.S. PATENT DOCUMENTS

| | | | |
|---|---|---|---|
| 5,416,484 | 5/1995 | Lofstrom | 327/77 |
| 5,563,598 | 10/1996 | Hickling | 341/155 |
| 5,796,301 | 8/1998 | Tanabe et al. | 330/9 |
| 5,894,284 | 4/1999 | Garrity et al. | 327/337 |

*Primary Examiner*—Toan Tran
*Attorney, Agent, or Firm*—Jean-Marc Zimmerman, Esq.

[57] ABSTRACT

A differential receiver having a precision input referred offset and a wide CMR, wherein a pair of differential-difference amplifiers are used as differential comparators. The differential-difference amplifiers are configured to allow a precision input-referred offset to be set by the use of two reference voltages. The differential comparators each have a common-mode range over a different portion of the rail-to-rail voltage range. A first one of these differential comparators is activated when the input common-mode voltage is above a threshold level. A second differential comparator is activated when the input common-mode voltage is below the threshold. The output of the differential comparator that is selected is to provide a comparison output signal, thereby achieving a wide CMR. The selection of either the first or second differential comparator is made by a selection circuit that includes a differential Schmitt Trigger and a multiplexer.

20 Claims, 5 Drawing Sheets

FIG. 8

| 72 | 72' | DIGITAL LOGIC UNIT 74 |
|---|---|---|
| 0 | 0 | UNDEFINED INPUT TO PAD AND PADN |
| 0 | 1 | 1 |
| 1 | 0 | 0 |
| 1 | 1 | Z |

WIDE COMMON-MODE DIFFERENTIAL RECEIVER WITH PRECISION INPUT REFERRED OFFSET

FIELD OF THE INVENTION

The present invention relates to differential receivers, and more particularly to a wide common-mode differential receiver with a precision input referred offset.

BACKGROUND OF THE INVENTION

Differential receivers are important components of computer networks and other computer interfaces. For example, the Universal Serial Bus (USB), the Low Voltage Differential Signal (LVDS) and the IEEE 1394 (FireWire) Interface all require differential receivers in order to operate. Differential receivers are typically used to distinguish logic states in a received signal, while differential squelch receivers are typically used to distinguish ternary data.

For example, the IEEE 1394 Interface uses differential signaling for transmission and reception of ternary data, namely the logic states "1", "0" and "Z." The logic states "0" and "1" are transmitted as small-swing differential voltages of about ±220 millivolts. The "Z" state implies a differential voltage of less than 89 millivolts.

Differential receivers employ differential squelch comparators to distinguish between these voltage levels. To do so, the differential squelch comparator must have a controlled input offset. Generally, an input offset voltage specification is a measure of how much the voltage on one input terminal must differ from the voltage on another input terminal in order to drive the output to the midpoint of its range.

For many analog circuits it is desirable to have an input offset that is as small as possible in order to minimize the noise in the circuit. For differential squelch comparators, a controlled non-zero input offset permits the circuit to discriminate against differential signals below a certain value. This capability is also used in analog-to-digital converters where multiple thresholds are discriminated to quantize an analog signal.

One known technique for creating a controlled input offset is to use a resistor divider network for dividing the input voltage by a specified amount. For example, FIG. 1 shows a conventional resistor divider network 10 which is employed to obtain a precise input referred offset for a differential comparator 12. The output "Z" of the differential comparator 12 is then read by the digital log unit 14. The output "Z" is given as $V_{out} = K*[(PAD-PADN)+(R_1/R_2)*Vdd]$, where constant $K = A_{diff}*[1/(1+(R_1/R_2))]$ and $A_{diff}$ is defined as the gain of the differential comparator. FIG. 2 shows a plot of the input referred offset voltage of the conventional differential comparator shown in FIG. 1, wherein the comparator has an input referred offset voltage of 0 v. FIG. 3 shows a plot of the input referred offset voltage of the comparator shown in FIG. 1 with hysteresis, wherein the comparator has an input referred offset voltage of $v_{r+}$ when the voltage goes high, i.e., from a negative value to a positive value, and an input referred offset voltage of $v_{r-}$ when the voltage goes low, i.e., from a positive value to a negative value.

The resistor divider network 10 provides a fixed offset voltage of $(R_1/R_2)*V_{dd}$, which is independent of process and temperature variations. However, employing resistor divider network 10 to create a controlled input offset suffers from several drawbacks. First, to create a small offset requires that the resistors R1 and R2 be mismatched by a very small amount. For example, to create an offset of 89 mV with V=3.0 would require that $R_1/R_2=0.029$. This may be hard to achieve because it requires that $R_1$ be small compared to $R_2$. Second, since the offset voltage of the comparator shown in FIG. 1 is determined by the ratio of the resistors of the resistor network, and since this network is fixed once the device is fabricated, the offset can not be changed.

Resistor divider network 10 has a common-mode bias relative to $V_{dd}$ when the inputs PAD/PADN are not coupled to any external circuit load. This is problematical for interfaces like the IEEE 1394 Interface which relies on the common-mode bias to be $V_{ss}$ when inputs PAD/PADN are not coupled to another circuit.

If the inputs PAD/PADN are coupled directly to MOS inputs then the center-tap of the termination network between PAD and PADN can be coupled to $V_{ss}$ via a large pull-down resistor. Thus when the inputs PAD and PADN are not coupled to an external load, the common-mode voltage becomes Vss via the large pull-down resistor. A rail-to-rail comparator has a nonlinear behavior and cannot be used to create a precision input-referred offset at the output.

Another approach to providing a controllable offset in a differential circuit is disclosed in U.S. Pat. No. 4,754,169 to Morris which uses a reference current derived from a reference voltage and an on-chip resistor to set the currents through two input transistors. An offset resistor in the source lead of one of the transistors produces a voltage drop that sets the offset at an input of the differential stage.

In addition to having a controllable offset voltage, differential comparators used in differential receivers must also have other beneficial characteristics. One figure of merit of a differential comparator is how large the differential input voltage must be in order to cause the output voltage to change from high to low, or vice-versa. In particular, when the voltage on the first (non-inverting) input 16 in the differential comparator 12 in FIG. 1 is higher than the voltage on the second (inverting) input 18, then the output Z of the comparator 20 is high. Alternatively, when the voltage on the first input is less than the voltage on the second input, the comparator output is low. The difference between the voltages on the first and second inputs is referred to as the "differential input voltage."

Another figure of merit is referred to as the common mode range (CMR), which is the voltage range over which a small differential input signal can be detected. Most differential comparators have a rather limited CMR as compared to the full power supply voltage range, which is often referred to as the "rail-to-rail" voltage range. Typically, a comparator with p-channel field effect transistor input devices has a CMR from the negative power supply voltages, $V_{ss}$ (0 volts) to about $V_{dd}$–1.5 volts. A comparator with n-channel field effect transistor input devices has a CMR from about 1.5 volts to $V_{dd}$.

A relatively large CMR is necessary for many differential receiver applications. For example, the USB specification requires a receiver with a rail-to-rail CMR. The LVDS specification also requires a receiver with a large CMR that conventional comparators are unable to meet. One design that achieves a relatively large CMR range is disclosed in the *IEEE Journal of Solid-State Circuits*, Vol. 30, February 1995, pp. 156–159. However, that design is relatively complicated and requires a large integrated circuit (IC) chip area since it is more like an operational amplifier than a comparator.

It is therefore an object of the present invention to create a differential squelch receiver having an input offset that can be easily controlled to a specified level. It is another object of the invention to provide a differential squelch comparator having a wide (rail-to-rail) CMR. It is a further object of the invention to create a differential squelch receiver that does not require a resistor divider network to implement a controlled input offset.

SUMMARY OF THE INVENTION

The present invention is a differential receiver having a precision input referred offset and a wide CMR. The differential receiver employs a pair of differential-difference amplifiers as differential squelch comparators. The differential-difference amplifiers are configured to allow a precision input-referred offset to be set by the use of two reference voltages. The differential squelch comparators each have a CMR over a different portion of a rail-to-rail voltage range. A first one of these differential squelch comparators is activated when the input common-mode voltage is above a threshold level. A second one of these differential squelch comparators is activated when the input common-mode voltage is below the threshold. The output of the differential comparator is selected to provide a comparison output signal, thereby achieving a wide CMR.

The differential receiver also includes a selection circuit comprised of a differential Schmitt Trigger and a multiplexer (MUX) to select either the first or second differential comparators. The Schmitt Trigger thresholds are selected to be in an overlapping region of the CMRs of the first and second differential squelch comparators. Errors in the differential squelch comparator outputs are reduced because both comparators are active in the switching region.

DETAILED DESCRIPTION OF THE DRAWINGS

The following detailed description relates to a technique and circuitry for performing a differential comparison that provides for a precision input-referred offset and improved CMR. Although voltage comparators are shown in the illustrative embodiment described herein, current comparators may benefit from use of the inventive technique, and are considered to be within the teachings of the present invention. In the illustrative embodiment shown in FIGS. 4 and 6, a differential-difference amplifier (DDA) circuit 22 is shown. This DDA is used to implement a precision input-referred offset. The behaviour of the circuit is a step-function described by the equation:

$$V_{out}=u[(PAD-PADN)-(V_{ref1}-V_{ref2})] \quad \text{Eq. 1}$$

where u is a step function. If $V_{ref1}$ and $V_{ref2}$ are fixed reference voltages, then, $(V_{ref1}-V_{ref2})=V_{off}$, where $V_{off}$ is a constant. The output Z at 24 is given by the equation:

$$V_{out}=u[(PAD-PADN)-V_{off}] \quad \text{Eq. 2}$$

which provides a fixed input-referenced offset at the output. This offset can be easily adjusted by changing $V_{ref1}$ and $V_{ref2}$. The precision of the resulting offset is much easier to control by adjusting this voltage difference rather than by controlling small resistance ratios in a resistor divider network as is conventionally done.

Figure 6:
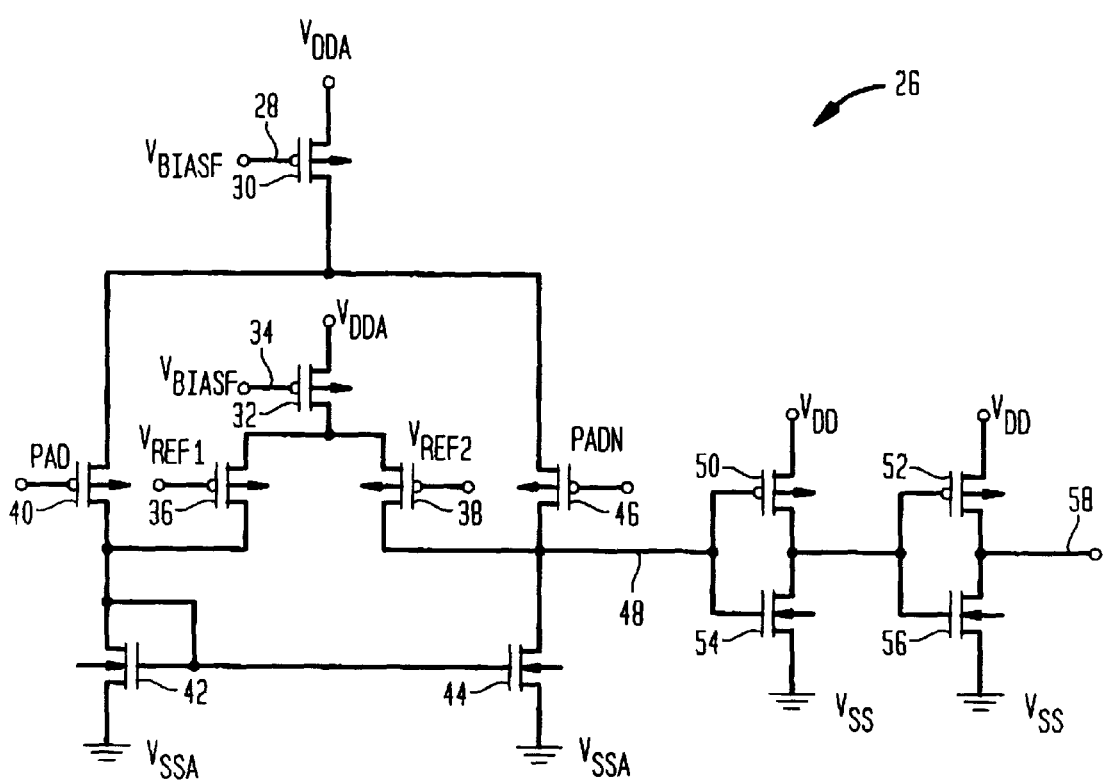
FIG. 6 shows an exemplary embodiment of the differential-difference amplifier shown in FIG. 4.

FIG. 6 shows an implementation of the DDA 22 according to a preferred embodiment of the present invention. This DDA 26 converts voltage to current, adds the currents, and then converts the current back to a voltage.

Figure 1:
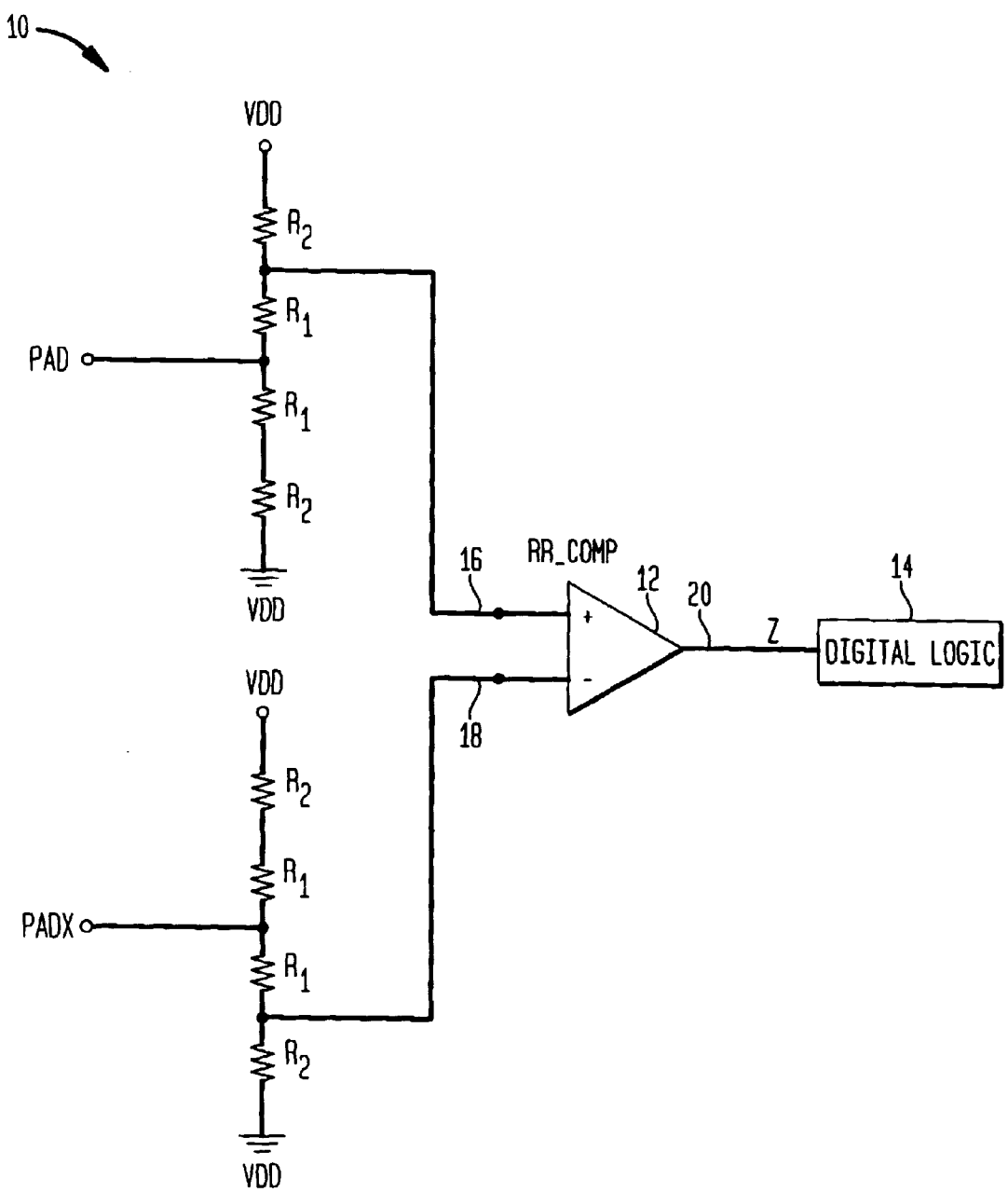
FIG. 1 shows a conventional differential comparator.
Figure 2:
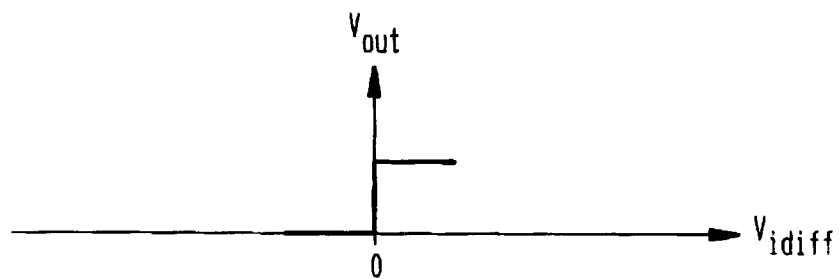
FIG. 2 shows a plot of the input referred offset voltage of the comparator shown in FIG. 1
Figure 3:
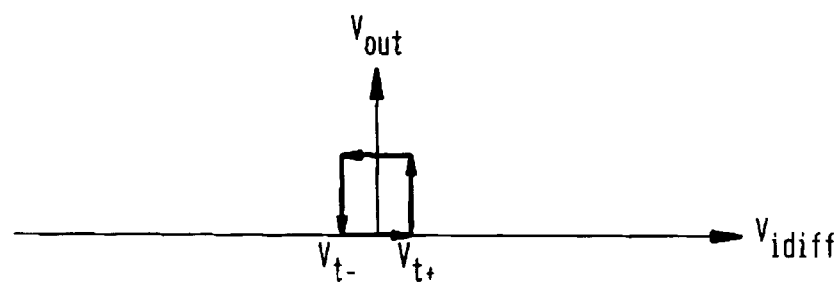
FIG. 3 shows a plot of the input referred offset voltage of the comparator shown in FIG. 1 with hysteresis.
Figure 4:
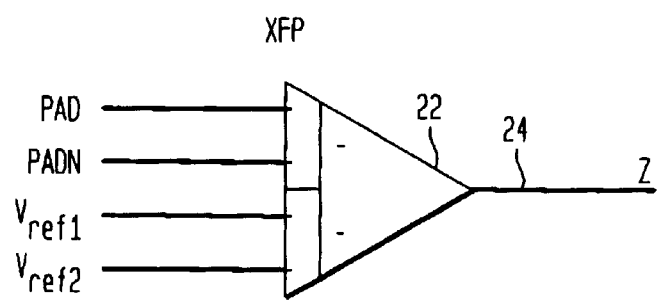
FIG. 4 shows an exemplary embodiment of a differential-difference amplifier which is employed as a differential squelch comparator according to the present invention.
Figure 5:
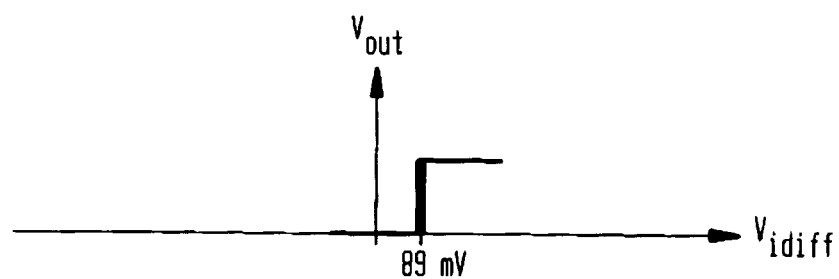
FIG. 5. shows a plot of the input referred offset voltage of the differential-difference amplifier shown in FIG. 4.

FIG. 5. shows a plot of the input referred offset voltage of the differential-difference amplifier shown in FIG. 4. If the differential voltage is less than 89 mV, then the output is "0." If, however, the differential output is greater than 89 mV, then the output is "1". This plot shows the behavior for a comparator having an input referred offset voltage of 89 mV.

The DDA 26 provides a precision offset. However, it has a limited input common-mode range. For 3 V devices it only operates in the range of 2 V<(input common-mode voltage) <$V_{ss}$. To overcome this limitation, the present invention utilizes a combination of two DDAs similar to the one shown in FIG. 6. The result is the differential receiver 60 shown in FIG. 7. This differential receiver 60 extends the input common mode range to $V_{dd}$<(input common-mode voltage)<$V_{ss}$.

Figure 7:
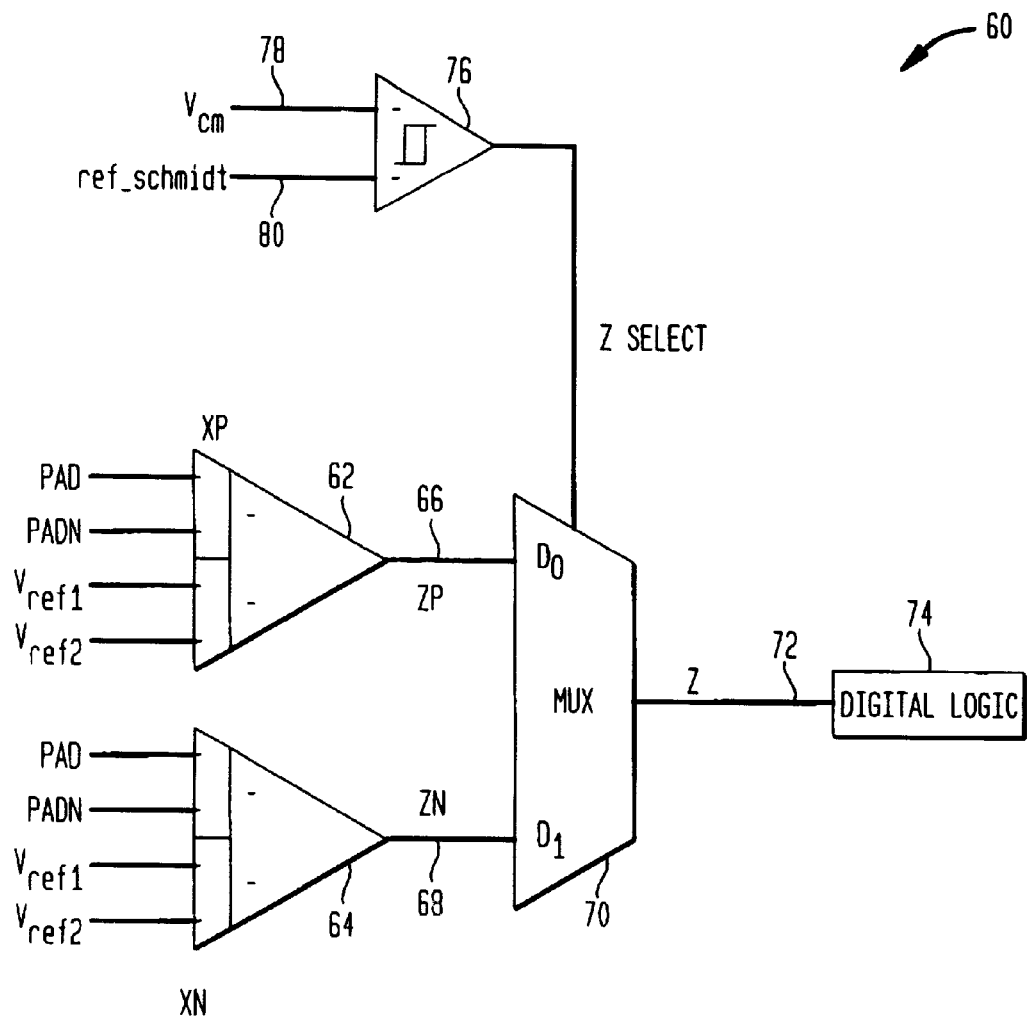
FIG. 7 shows an exemplary embodiment of a differential receiver according to the present invention.

As shown in FIG. 7, the differential receiver 60 uses two parallel DDAs 62 and 64, wherein DDA 62 consists of a PMOS input stage while DDA 64 consists of an NMOS input stage. Thus, transistors 36, 40 and 38, 46 shown in FIG. 6 are implemented as PMOS transistors in DDA 62 and NMOS transistors in DDA 64, respectively. DDA 62 is active in the low-to-mid common-mode input range. DDA 64 is active in the mid-to-high common mode input range. There is an overlap region during which both DDAs are active. The outputs 66 and 68 of the DDAs 62 and 64 are multiplexed together by multiplexer 70 and sent out as a single output 72 to the digital logic unit 74. Since a digital device can evaluate $2^n$ logic states where n=the number of inputs to the logic device, and since there is only a single input to the digital logic unit 74 shown in FIG. 7 such that n=1, it follows that the digital logic unit 74 can only evaluate two logic states since $2^n=2$ and thus interpret the input signal as either a "1" or a "0."

Alternatively, the output of a second comparator circuit identical to the one shown in FIG. 7 and having an output 72' can also be coupled to digital logic unit 74 such that n=2 thereby enabling the digital logic unit 74 to evaluate up to four logic states since $2^n=4$ and thus interpret the input signal as either a "1", "0" or "Z" as shown in Truth Table 1.

A differential Schmitt Trigger 76 controls the multiplexer 70 by generating an output that causes the multiplexer 70 to select either the DDA 62 or the DDA 64 output. The differential Schmitt Trigger 76 compares the input common-mode voltage 78 to the mid-voltage of the overlap region between DDAs 62 and 64. If the input common-mode voltage falls below the mid-voltage of the overlap region, the output 66 of DDA 62 is selected. If the input common-mode voltage rises above the mid-voltage of the overlap region, the output 68 of DDA 64 is selected.

In a preferred embodiment, the multiplexer 70 is implemented by the use of a simple circuit employing four pass transistors coupled to the comparator outputs. One example of such a circuit is disclosed in pending U.S. patent application Ser. No. 08/740,815 entitled "Differential Comparison Circuit Having Improved Common-Mode Range" which was filed on Nov. 1, 1996. It may also be desirable to lower the DC power consumption of the differential receiver 60 by disabling the comparator whose output is not selected to be the comparison output. A technique for implementing such disabling is taught in the aforementioned patent application.

The Schmitt Trigger 76 thresholds are selected such that both DDA outputs 66 and 68 are active in the switching region. This eliminates any errors at the single output 72 coupled to the digital logic unit 74. Use of the differential Schmitt Trigger 76 allows precise switching between the comparators 62 and 64. It will be appreciated that, while it is preferable to have the Schmitt Trigger thresholds set in the overlap region, there are other ways of determining these thresholds besides the technique described above, such as by using a conventional comparator without a Schmitt Trigger.

As an illustrative example, the differential receiver 60 may be used in the aforementioned IEEE 1394 Interface which uses differential signaling for transmitting and receiving data. Logic states are transmitted as small-swing differential voltages of about ±220 mV. The differential receiver 60 can be used throughout this rail-to-rail common-mode voltage range.

Ternary data, in particular, "1", "0", and "Z" states, are transmitted by three corresponding differential voltages. In particular, for a received differential pair A and A*, the logic states are determined as follows: if (VA–VA*)>168 mV, then a "1" is received; if (VA–VA*)<–168 mV, then a "0" is received; and if –89 mV<(VA–VA*)<89 mV, then a "Z" is received. The value of VA–VA* is determined by the selected differential comparator 62 or 64 and this value is transmitted to digital logic unit 74 through line 72.

The embodiment described herein shows comparators optimized with regard to differential input voltage sensitivity over a given portion of the rail-to-rail range. However, other performance characteristics such as speed and noise level may be used as the basis for comparator selection. Moreover, the magnitude of the input levels need not extend from rail-to-rail, e.g., $V_{ss}$ to $V_{dd}$, in some applications. Also, the DDAs 62 and 64 may be implemented in technologies other than the CMOS technology illustrated herein, such as bipolar integrated circuit technology or BICMOS technology. In those cases, bipolar NPN transistors may be used in lieu of the n-channel input field effect transistors, and bipolar PNP transistors may be used in lieu of the p-channel input field effect transistors illustrated.

Whereas two comparators are shown in the embodiment illustrated in FIG. 7, the inventive technique may be implemented with three or more comparators, each activated over a different range of signal levels. In this manner, larger signal level ranges may be covered for a given desired performance level than with typical conventional techniques. The comparators are typically implemented on a single integrated circuit. The inputs to the comparators may then be coupled to signal sources which originate on that integrated circuit, or alternatively they may be coupled to signal sources which are external to the integrated circuit. Similarly, the comparison output may be supplied to circuitry on the integrated circuit, or may be supplied externally.

Numerous modifications to and alternative embodiments of the present invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claims is reserved.

What is claimed is:

1. An integrated circuit comprising a differential comparator having an input offset voltage comprising:

first and second differential voltage inputs;

first and second reference voltage inputs;

a first comparator circuit for generating an output voltage that is a function of the difference between the first and second differential voltage inputs minus the difference between the first and second reference voltage inputs, whereby the comparator has an input offset that is a function of the difference between the first and second reference voltage inputs; and a second comparator circuit for generating an output voltage that is a function of the difference between the first and second differential voltage inputs minus the difference between the first and second reference voltage inputs, whereby the second differential comparator has an input offset that is a function of the difference between the first and second reference voltage inputs; and a selection circuit responsive to a common-mode input voltage of the first and second input voltages for selecting either the first comparator or the second comparator to provide an output for the differential comparator.

2. The integrated circuit according to claim 1, the first comparator comprising:

means for converting the first and second input voltages into currents;

means for adding the resulting currents; and means for converting the added current back into voltages.

3. The integrated circuit according to claim 2, wherein the output voltage $V_{out}$ is defined by the equation $V_{out}=u[(V_{in1}-V_{in2})-(V_{ref1}-V_{ref2})]$, and wherein $V_{in1}$ and $V_{in2}$ are the first and second input voltage inputs, $V_{ref1}$ and $V_{ref2}$ are the first and second reference voltages, and u is a step function.

4. The integrated circuit according to claim 3, wherein the first comparator circuit operates over a first common-mode voltage range and the second comparator circuit operates over a second common-mode voltage range such that the differential comparator operates over a wide input common-mode voltage range.

5. The integrated circuit according to claim 3, wherein the selection circuit comprises a multiplexer and a trigger circuit coupled to the multiplexer, the trigger circuit comparing the common-mode input voltage to a threshold and generating an output to the multiplexer that depends on whether the common-mode input voltage exceeds the threshold.

6. The integrated circuit according to claim 5, wherein the trigger circuit comprises a Schmitt Trigger and the threshold is a voltage value that is in an overlap region of the common-mode ranges of the comparator circuit and the second comparator circuit.

7. The integrated circuit according to claim 6, wherein the Schmitt Trigger is a differential Schmitt Trigger.

8. The integrated circuit according to claim 1, wherein the first and second reference voltage inputs are each fixed.

9. A differential receiver for providing a differential receiver output that is a function of the difference between first and second received signal voltage levels, comprising:

first and second differential voltage inputs receiving the first and second received signal voltage levels;

first and second reference voltage inputs;

first and second comparators each receiving the first and second differential voltage inputs and the first and second reference voltage inputs, the first and second comparators generating first and second comparator outputs, the first comparator operating over a first common-mode voltage range and the second comparator operating over a second common-mode voltage range, wherein the first and second voltage reference inputs provide predetermined input offsets to the comparators; and a selection circuit responsive to a common-mode input voltage of the first and second differential voltage inputs for selecting either the first comparator output or the second comparator output to provide the differential receiver output.

10. A differential receiver according to claim 9, wherein the combination of the first and second comparators enable the differential receiver to operate over a wide common-mode input voltage range.

11. A differential receiver according to claim 10, wherein the selection circuit comprises a multiplexer and a trigger circuit coupled to the multiplexer, the trigger circuit comparing the common-mode input voltage to a threshold and generating an output to the multiplexer that depends on whether the common-mode input voltage exceeds the threshold.

12. A differential receiver according to claim 11, wherein the trigger circuit comprises a differential Schmitt Trigger and the threshold is a voltage value that is in an overlap region of the common-mode ranges of the first and second comparators.

13. A differential receiver according to claim 12, wherein the first and second comparators generate an output voltage that is a function of the difference between the first and second differential voltage inputs minus the difference between the first and second fixed reference voltage inputs, whereby the comparator has an input offset that is a function of the difference between the first and second fixed reference voltage inputs.

14. A differential receiver according to claim 9, wherein the first and second comparators comprise differential difference amplifiers.

15. A differential receiver according to claim 9, wherein the first comparator includes n-channel transistors and the second comparator includes p-channel transistors.

16. A differential receiver according to claim 9, wherein the first and second comparators are voltage comparators.

17. A differential receiver according to claim 9, wherein the first and second comparators are current comparators.

18. A method for detecting logic states in a received differential signal, comprising the steps of:

receiving first and second differential voltage inputs;

receiving first and second reference voltage inputs; and generating an output voltage using a first differential comparator, wherein the output voltage is a function of the difference between the first and second differential voltage inputs minus the difference between the first and second reference voltage inputs, whereby the first differential comparator has an input offset that is a function of the difference between the first and second reference voltage inputs;

generating an output voltage using a second differential comparator, wherein the output voltage is a function of the difference between the first and second differential voltage inputs minus the difference between the first and second reference voltage inputs, whereby the second differential comparator has an input offset that is a function of the difference between the first and second reference voltage inputs; and selecting either the first comparator or the second comparator to provide an output in response to the magnitude of the first and second voltage inputs.

19. The method according to claim 19, each step of generating an output voltage comprising the steps of:

converting the first and second input voltages into currents;

adding the resulting currents; and converting the added current back into voltages.

20. The method according to claim 19, the step of selecting further comprising the step of comparing the first and second input voltages to a threshold and generating an output that depends on whether the first and second input voltages exceed the threshold.

* * * * *